United States Patent [19]
Thurber, Jr.

[11] Patent Number: 5,414,314
[45] Date of Patent: May 9, 1995

[54] HIGH SWING INTERFACE STAGE

[75] Inventor: Charles R. Thurber, Jr., Sunnyvale, Calif.

[73] Assignee: Maxim Integrated Products, Sunnyvale, Calif.

[21] Appl. No.: 257,194

[22] Filed: Jun. 9, 1994

[51] Int. Cl.⁶ .................................... H03K 19/0185
[52] U.S. Cl. .................................. 327/427; 327/333; 326/68
[58] Field of Search ............... 307/475, 451, 571, 584, 307/585, 572, 264

[56] References Cited

U.S. PATENT DOCUMENTS

| | | | |
|---|---|---|---|
| 4,380,710 | 4/1983 | Cohen et al. | 307/585 |
| 5,136,190 | 8/1992 | Chern et al. | 307/264 |
| 5,194,767 | 3/1993 | Chao | 307/475 |
| 5,237,213 | 8/1993 | Tanoi | 307/572 |

*Primary Examiner*—Timothy P. Callahan
*Assistant Examiner*—Eunja Shin
*Attorney, Agent, or Firm*—Blakely, Sokoloff, Taylor & Zafman

[57] ABSTRACT

An integrated CMOS high swing interface output stage which can transmit and receive data from other devices which may include devices operating from a different, particularly a higher, voltage power supply. The interface utilizes three P-channel devices in a common well on the substrate and three N-channel devices in another common well on the substrate. Two of the three P-channel devices are connected in series between the positive power supply terminal and the output of the interface and two of the N-channel devices are connected in series between the output of the interface and a negative power supply terminal. The third P-channel device is connected between the common connection of all three P-channel devices and the local substrate and the gate of the P-channel device which is connected to the positive power supply terminal. The third N-channel device is similarly connected between the common connection of all three N-channel devices and the respective local substrate and the gate of the N-channel device connected to the negative power supply terminal. Appropriate control of all six devices provides free swinging of the output beyond the range of the power supply when not powered and when powered but inactive, while providing drive of the output when the interface is active.

10 Claims, 2 Drawing Sheets

5,414,314

HIGH SWING INTERFACE STAGE

BACKGROUND OF THE INVENTION

1. Field of the Invention

The present invention relates to the field of standard interfaces, and more particularly to interfaces which can transmit and receive data from other devices which may include devices operating from a different, particularly a higher voltage, power supply.

2. Prior Art

Interface standards such as RS485 and RS232 have been used for a long time and will continue to be used despite the drop in the standard power supply voltages below 5 V. The output swing of the RS485/232 standards do not allow the traditional output stages to be used at a supply voltage of 3.3 V ±0.3 V. Portable computers will be using only 3.3 V power supplies very soon, and they still need these interface chips to communicate with other computers and peripherals. A new output stage disclosed herein has been generated which allows the lower power supply voltage, yet meets these interface standards.

Two different traditional techniques are shown in FIG. 1 and 2. FIG. 1 illustrates a bipolar technique and FIG. 2 illustrates a CMOS technique. The bipolar technique has an output voltage high level of $V_{cc} - [V_{ce1(sat)} + V_{be2}]$. This typically comes out to be $V_{cc} - 1.05$ V. The bipolar technique has an output voltage low level of $V_{d5} + V_{ce3(sat)}$. This typically comes out to be 0.8 V. The CMOS technique has an output voltage high level of $V_{cc} - [V_{ds7} + V_{d6}]$. This typically comes out to be $V_{cc} - 0.8$ V. The CMOS technique has an output voltage low level of $V_{d9} + V_{ds8}$. This typically comes out to be 0.8 V. If these techniques were to be used at a supply voltage of 3.0 V, the bipolar differential output swing would be $3.0 - (1.05 + 0.8) = 1.15$ V and the CMOS technique would be $3.0 - (0.8 + 0.8) = 1.4$ V. RS485 standards require 1.5 V differentially across a 54 ohm load. RS422 requires 2.0 V (single-ended) across a 100 ohm load. Clearly neither technique satisfies either specification at the reduced supply voltage.

Each previous technique used a Schottky diode in series with an active device (NPN, PNP, PMOS or NMOS) to isolate the output from the power supplies. This allows the output to be pulled above or below the power supply by devices on the same bus operating from a higher voltage supply without driving current into either lower voltage supply. The biggest problem with using Schottky diodes is that their forward biased voltage is around 450 mV. In the bipolar case, the largest differential voltage (while using a 3.0 V supply) is $[3.0 - (0.35 + 0.7 + 0.45 + 0.35)] = 1.15$ V. This will not allow either RS485 or RS422 to be driven. In the CMOS case, the largest differential voltage (again while using a 3.0 V supply) is $[3.0 - (0.35 + 0.45 + 0.45 + 0.35)] = 1.40$ V. This will still not allow either RS485 or RS422 to be driven. Note this is true even if the active devices were made large ($V_{ds}$ or $V_{ce} < 0.35$ V).

BRIEF SUMMARY OF THE INVENTION

An integrated CMOS high swing interface output stage which can transmit and receive data from other devices which may include devices operating from a different, particularly a higher, voltage power supply. The interface utilizes three P-channel devices in a common well on the substrate and three N-channel devices in another common well on the substrate. Two of the three P-channel devices are connected in series between the positive power supply terminal and the output of the interface and two of the N-channel devices are connected in series between the output of the interface and a negative power supply terminal. The third P-channel device is connected between the common connection of all three P-channel devices and the local substrate and the gate of the P-channel device which is connected to the positive power supply terminal. The third N-channel device is similarly connected between the common connection of all three N-channel devices and the respective local substrate and the gate of the N-channel device connected to the negative power supply terminal. By holding the third P-channel and N-channel devices on when the circuit is powered but inactive, the P-channel and N-channel devices connected to the respective power supply terminal are held off, independent of the voltage of the output terminal, allowing other devices in the system to drive the output beyond the voltage range of the interface power supply without presenting a load to such other devices. When unpowered, parasitic devices hold the circuit in a state not loading the output if driven by other devices in the system. Holding the P-channel and N-channel devices connected to the power supply terminals on when the interface is powered and active allows the other series P-channel and N-channel devices to drive the output high or low in accordance with the gate signal supplied thereto.

DETAILED DESCRIPTION OF THE INVENTION

Figure 1:
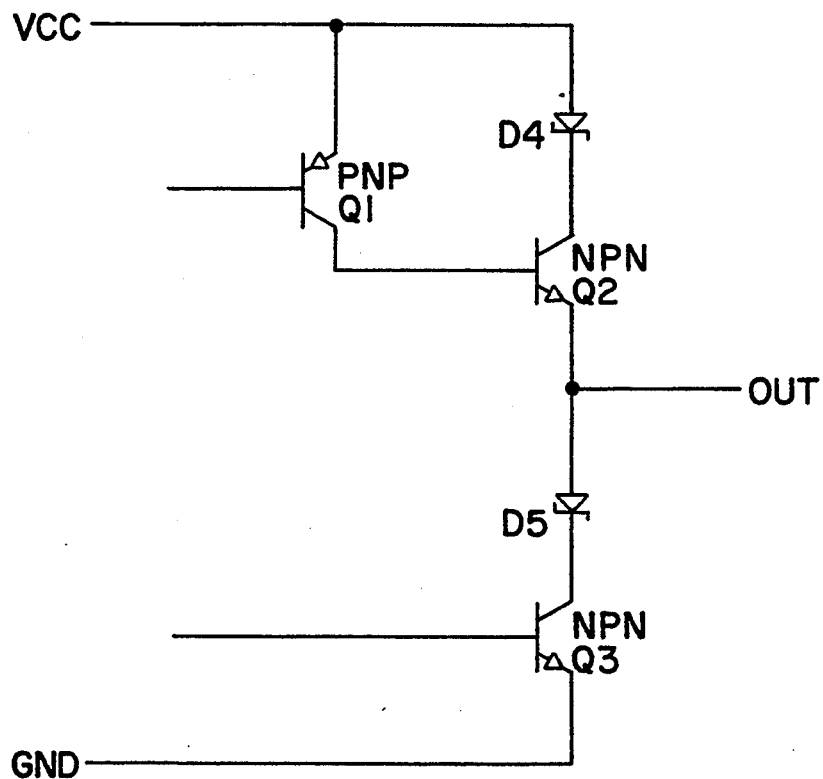
FIG. 1 is a circuit diagram illustrating a traditional interface output stage of bipolar design.
Figure 2:
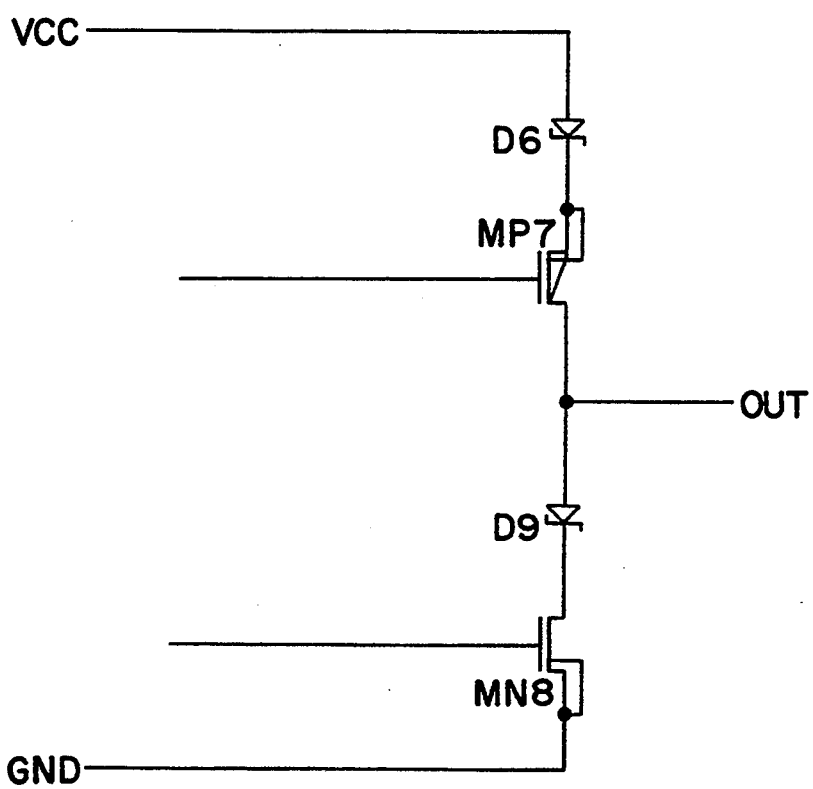
FIG. 2 is a circuit diagram illustrating a traditional interface output stage of a CMOS design.
Figure 3:
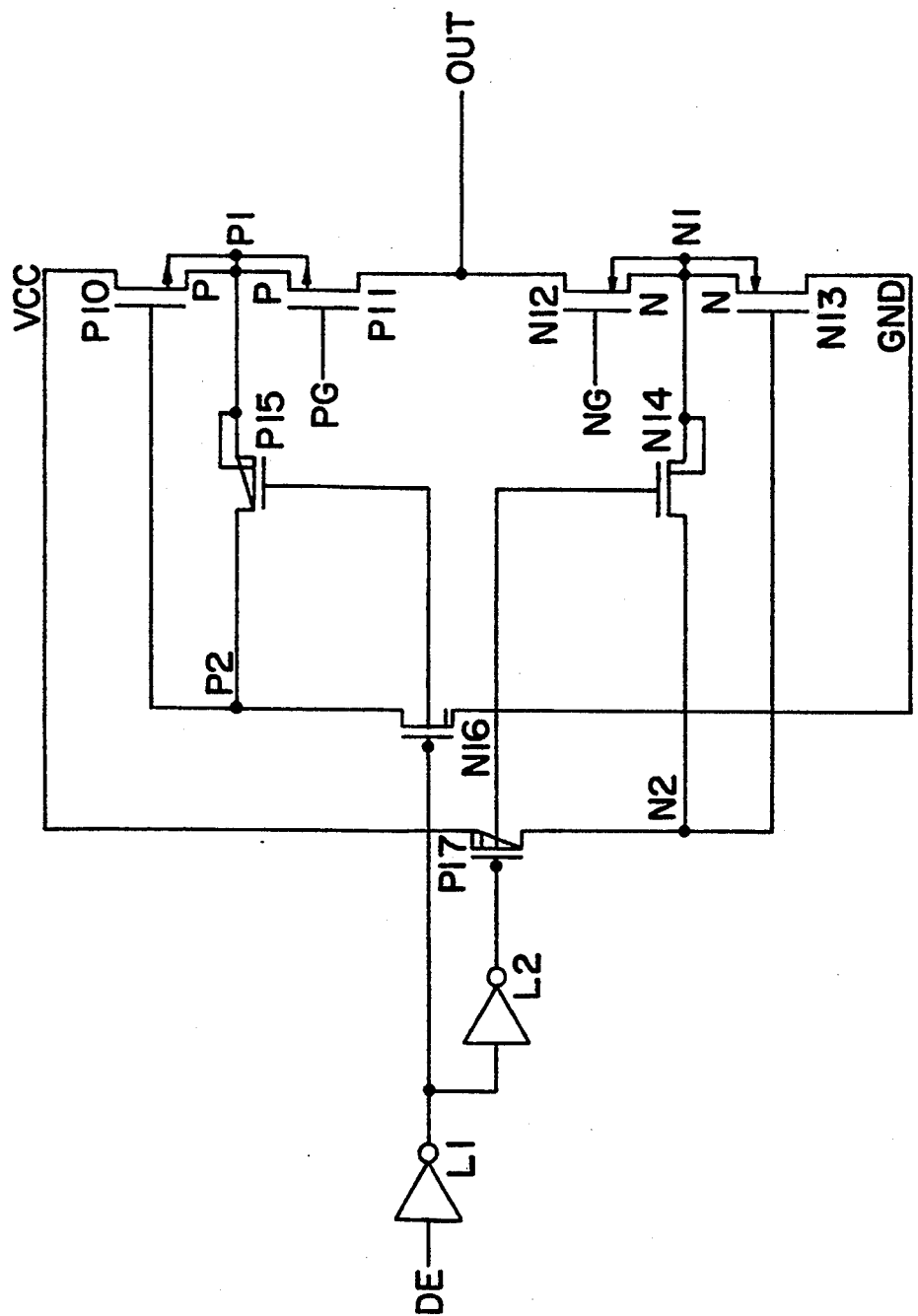
FIG. 3 is a circuit diagram of the present invention illustrating a high swing interface output stage wherein the output high and low levels can be made very close to the supply rails.

In the description herein, P-channel transistors are designated by a "P" followed by the specific numerical designation used for the specific transistor in the drawings, and N-channel transistors are designated by an "N" followed by the specific numerical designation used for the specific transistor in the drawings, FIG. 3 is a circuit diagram for the high swing interface of the present invention wherein the output high and low levels can be made very close to the supply rails. The only limitation as to how close to the supply rails the circuit will drive the output is how large transistors P10, P11, N12 and N13 are made. These transistors can be made just large enough to make the specified interface standards at the minimum supply voltage and worst case temperature/process extremes, as any further increase in device size would just make the die larger and more expensive without any particular advantage.

Nearly all interface standards require the output to be driven above and/or below the power supply rails with the power on or power off. This allows sharing of the data bus with other device drivers operating from a higher supply voltage without loading down such higher voltage drivers by any parasitic diodes in lower voltage devices. (These diodes are intrinsic to any fabrication process and must always be accounted for.) This new stage can also have this feature by the addition of two devices N14 and P15. These devices keep current from flowing into the supply when the output is disabled and the output is pulled above and/or below the supplies. This is true even if the supply voltage is 0 V.

As shown in FIG. 3, transistors P10, P11 and P15 are formed in a well in the substrate of the integrated circuit, with the common connection of the three devices being connected to their well. Similarly, transistors N12, N13 and N14 are formed in another well in the substrate of the integrated circuit, with the common connection of these three devices also being connected to their well. Transistors N16 and P17 are of conventional CMOS construction, with transistor N16 having its source and substrate or well connected to ground and with transistor P17 having its source and well or substrate connected to VCC. For purposes of convention and specificity herein, the device connection connected to the (local) substrate or well will be referred to herein as the source.

There are four different modes of operation of the circuit of FIG. 3. The first three are listed in the decode table below. The fourth mode is the unpowered mode.

| DECODE TABLE (states not listed are illegal) | | | |
| --- | --- | --- | --- |
| DE | PG | NG | OUTPUT STATE |
| 1 | 1 | 0 | 3 STATE (output is high impedance) |
| 0 | 0 | 0 | PULLING UP |
| 0 | 1 | 1 | PULLING DOWN |

The first mode is when the device is powered up but the device coupled to the output stage is not active and the output stage output is high impedance. This is used when other drivers on the bus are active (only one driver is active on the bus at any one time). The DE signal is high, PG is high, NG is low, the output of the inverter L1 is low and the output of the inverter L2 is high. ("High" is referenced to VCC, even though other circuits in the system may operate from a still higher voltage power supply.) This holds both N16 and P17 off, and holds P15 and N14 on. The four output devices P10, P11, N12 and N13 all have $V_{gs}=0$ V (zero gate source voltages) causing all of them to be off whether the output is in between the supplies or is above or below the supplies. The only limitation to this is that the breakdown of the devices must be greater than the fault voltage (i.e. >12 V for RS485).

The second mode is when the output is driving (DE=0) and pulling high (NG is low and PG is low). With the DE signal low, the output of the inverter L1 is high and the output of the inverter L2 is low. This turns both N16 and P17 on, turning P15 and N14 off and turning P10 and N13 on. However, because NG is low, N12 is off. Thus although N13 is also on, N12 prevents any current flowing into ground. But because PG is low, P11 is on, so that the series combination one P10 and P11, both of which are on, will pull the output high.

The third mode is when the output is driving (DE=0) and pulling low (NG is high and PG is high). As with the second mode, the DE signal is low, the output of the inverter L1 is high and the output of the inverter L2 is low. This turns both N16 and P17 on, turning P15 and N14 off and turning P10 and N13 on. With both NG and PG high, N12 is on and P11 is off. Since both N12 and N13 are now on, the output is pulled low. Although P10 is also on, P11 being off prevents any current flowing from Vcc to the output.

The fourth mode is when the supplies are off (Vcc=0 V). It is assumed the outputs of inverters L1 and L2 are "clamped" by their intrinsic parasitic diodes and thus limited to ±0.7 V around ground. If the OUT signal is pulled high, the drain/body diode of P11 will pull node P1 above Vcc and turn on P15. When P15 is on, P10 cannot conduct any current and the output is high impedance. If instead, the OUT signal is pulled below GND, the drain/body diode of N12 will pull node N1 below GND and turn on N14. When N14 is on, N13 cannot conduct any current because N14 holds the voltage of the gate to the source of N13 at zero volts, and the output is again high impedance.

The present invention may be fabricated on either a P-type or an N-type substrate. By way one example, if fabricated on a P-type substrate, node N1 forming the common source, local substrate connection for devices N12, N13 and N14 would be an N-type well in the P-type substrate, and node P1 forming the common source, local substrate connection for devices P10, P11 and P15 would be P-type well in an N-type well in the P-type substrate. If fabricated on a N-type substrate, node N1 forming the common source, local substrate connection for devices N12, N13 and N14 would be an N-type well in a P-type well in the N-type substrate, and node P1 forming the common source, local substrate connection for devices P10, P11 and P15 would be P-type well in the N-type substrate.

While the present invention has been disclosed and described with respect to a certain preferred embodiments thereof, it will be understood to those skilled in the art that the present invention may be varied without departing from the spirit and scope of the invention.

I claim:

1. An integrated CMOS high swing interface output stage comprising:
    first, second and third P-channel devices formed in a common P-channel well in a substrate, each having a gate to turn the devices on and off;
    first, second and third N-channel devices formed in another common N-channel well in the substrate, each having a gate to control the conduction there through;
    the first and second P-channel devices being coupled in series between a positive power supply terminal and an output terminal, respectively, the third P-channel device being coupled between the common connection of the first and second P-channel devices and the gate of the first P-channel device, the common connection of the first, second and third P-channel devices being connected to the respective common well;
    the first and second N-channel devices being coupled in series between the output terminal and a negative power supply terminal, respectively, the third N-channel device being coupled between the common connection of the first and second N-channel devices and the gate of the second N-channel device, the common connection of the first, second and third N-channel devices being connected to the common N-channel well;
    circuitry for holding the third P-channel and the third N-channel devices on when the interface is powered and not active, and for holding the first P-channel and the second N-channel devices on when the interface is powered and active so that the second P-channel and the first N-channel devices can be controlled to determine the high and low states of the output terminal.

2. The integrated CMOS high swing interface output stage of claim 1 wherein the circuitry for holding the third P-channel and the third N-channel devices on when the interface is powered and not active, and for holding the first P-channel and the second N-channel devices on when the interface is powered and active comprises a fourth P-channel device and a fourth N-channel device, each having a gate to turn the devices on and off;

the fourth P-channel device being coupled between the positive power supply terminal and the gate of the second N-channel device;

the fourth N-channel device being coupled between the gate of the first P-channel device and the negative power supply terminal; and, circuitry for controlling the gates of the third and fourth P-channel devices and the third and fourth N-channel devices to controllably;
(a) turn both the third P-channel and the third N-channel devices on and both the fourth P-channel and the fourth N-channel devices off; and to,
(b) turn both the third P-channel and the third N-channel devices off and both the fourth P-channel and the fourth N-channel devices on.

3. The integrated CMOS high swing interface output stage of claim 2 wherein the circuitry for controlling the gates of the third and fourth P-channel devices and the third and fourth N-channel devices comprises:

a first control line coupled to the gates of the fourth N-channel and the third P-channel devices and a second control line coupled to the gates of the fourth P-channel and the third N-channel devices; and, circuitry for providing a voltage on the first control line of first and second voltage states, and the voltage on the second control line of the inverse of the voltage on the first control line.

4. The integrated CMOS high swing interface output stage of claim 3 wherein the circuitry for providing the voltage on the second control line of the inverse of the voltage on the first control line comprises an invertor coupled from the first control line to the second control line.

5. The integrated CMOS high swing interface output stage of any of claims 1 through 4 wherein one or more parasitic diodes of the integrated circuit hold the gates of the third P-channel and N-channel transistors near the voltage on the negative power supply terminal when power is not supplied to the positive power supply terminal, whereby the interface stage output terminal will exhibit a high impedance even if the interface stage output terminal is driven to voltages less than or beyond the normal positive and negative voltages on the power supply terminals.

6. An integrated CMOS interface stage having a high swing capability for interfacing with other devices which may operate on different and higher voltage power supplies comprising:

first, second and third P-channel transistors, each having an N-type body region having first and second P-type diffused regions and a gate therebetween, and first, second and third N-channel transistors, each having a P-type body region with first and second N-type diffused regions with a gate therebetween, the body regions of the first, second and third P-channel transistors being connected in common and to the first regions of the first, second and third P-channel transistors, and the body regions of the first, second and third N-channel transistors being connected in common and to the first regions of the first, second and third N-channel transistors, the second region of the first P-channel transistor being coupled to the second region of the first N-channel transistor and to an interface stage output terminal, the second region of the second P-channel transistor being coupled to the positive power supply terminal, the second region of the second N-channel transistor being coupled to the negative power supply terminal, the second region of the third P-channel transistor being coupled to the gate of the second P-channel transistor and the second region of the third N-channel transistor being coupled to the gate of the second N-channel transistor, the gates of the first P-channel and the first N-channel transistors providing the inputs for operating the first P-channel and N-channel transistors to drive the voltage on the interface stage output terminal high or low; and, circuitry for;
(a) turning on the second P-channel and N-channel transistors when power is supplied to the positive power supply terminal, whereby the first P-channel or the first N-channel transistor may be turned on to drive the voltage on the interface stage output terminal high or low, respectively;
(b) turning off the second P-channel and N-channel transistors and turning on the third P-channel and N-channel transistors when power is supplied to the positive power supply terminal and the interface stage is disabled, whereby the interface stage output terminal will exhibit a high impedance even if the interface stage output terminal is driven to voltages beyond the positive and negative voltages on the power supply terminals.

7. The integrated CMOS high swing interface output stage of claim 6 further comprising circuitry for holding the gates of the third P-channel and N-channel transistors near the voltage on the negative power supply terminal when power is not supplied to the positive power supply terminal, whereby the interface stage output terminal will exhibit a high impedance even if the interface stage output terminal is driven to voltages less than or beyond the normal positive and negative voltages on the power supply terminals.

8. The integrated CMOS high swing interface output stage of claim 7 wherein the circuitry for holding the gates of the third P-channel and N-channel transistors near the voltage on the negative power supply terminal when power is not supplied to the positive power supply terminal comprises one or more parasitic diodes of the integrated circuit.

9. A method of providing an interface stage having a high swing capability for interfacing with other devices which may operate on different and higher voltage power supplies comprising the steps of:
(a) providing first, second and third P-channel transistors having a common N-type body region, and each having first and second P-type diffused regions and a gate therebetween, and first, second and third N-channel transistors having a common P-type body region, each with first and second N-type diffused regions with a gate therebetween, the body region of the first, second and third P-channel transistors being connected in common and to the first regions of the first, second and third P-channel transistors, and the body region of the first, second and third N-channel transistors being connected to the first regions of the first, second and third N-channel transistors, the second region of the first P-channel transistor being coupled to the second region of the first N-channel transistor and to an interface stage output terminal, the second region of the second P-channel transistor being coupled to the positive power supply terminal, the second region of the second N-channel transistor being coupled to the negative power supply terminal, the second region of the third P-channel transistor being coupled to the gate of the second P-channel transistor and the second region of the third N-channel transistor being coupled to the gate of the second N-channel transistor, the gates of the first P-channel and N-channel transistors providing the inputs for operating the first P-channel and N-channel transistors to drive the voltage on the interface stage output terminal high or low;

(b) turning on the second P-channel and N-channel transistors when power is supplied to the positive power supply terminal, whereby the first P-channel or the first N-channel transistor may be turned on to drive the voltage on the interface stage output terminal high or low, respectively;

(c) turning off the second P-channel and N-channel transistors and turning on the third P-channel and N-channel transistors when power is supplied to the positive power supply terminal and the interface stage is disabled, whereby the interface stage output terminal will exhibit a high impedance even if the interface stage output terminal is driven to voltages beyond the positive and negative voltages on the power supply terminals; and, (d) holding the gates of the third P-channel and N-channel transistors near the voltage on the negative power supply terminal when power is not supplied to the positive power supply terminal, whereby the interface stage output terminal will exhibit a high impedance even if the interface stage output terminal is driven to voltages less than or beyond the normal positive and negative voltages on the power supply terminals.

10. The method of providing an integrated CMOS high swing interface output stage of claim 9 wherein the circuitry for holding the gates of the third P-channel and N-channel transistors near the voltage on the negative power supply terminal when power is not supplied to the positive power supply terminal comprises one or more parasitic diodes of the integrated circuit.

* * * * *

UNITED STATES PATENT AND TRADEMARK OFFICE
CERTIFICATE OF CORRECTION

PATENT NO. : 5,414,314
DATED : May 9, 1995
INVENTOR(S) : Thurber, Jr.

It is certified that error appears in the above-identified patent and that said Letters Patent is hereby corrected as shown below:

In column 7, claim 9 at line 9, please delete " connected " and insert
-- connected in common and --.

Signed and Sealed this

Twentieth Day of April, 1999

Attest:

Q. TODD DICKINSON

*Attesting Officer*  *Acting Commissioner of Patents and Trademarks*